(12) United States Patent
Huang et al.

(10) Patent No.: US 6,211,074 B1
(45) Date of Patent: Apr. 3, 2001

(54) METHODS AND ARRANGEMENTS FOR REDUCING STRESS AND PREVENTING CRACKING IN A SILICIDE LAYER

(75) Inventors: Richard J. Huang, Cupertino; Guarionex Morales, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/076,584

(22) Filed: May 12, 1998

(51) Int. Cl.[7] ..................... H01L 21/4763; H01L 21/336
(52) U.S. Cl. .................. 438/655; 438/257; 438/281; 438/592; 438/664
(58) Field of Search ..................... 438/655, 592, 438/682, 683, 664, 656, 651, 281, 294–307, 257–267

(56) References Cited

U.S. PATENT DOCUMENTS

| 5,554,552 | * | 9/1996 | Chi | 438/264 |
| 5,604,157 | * | 2/1997 | Dai et al. | 438/297 |
| 5,972,114 | * | 10/1999 | Yonenaga et al. | 118/715 |
| 5,981,339 | * | 11/1999 | Chang et al. | 438/257 |

OTHER PUBLICATIONS

Wolf, "Silicon Processing for the VLSI Era" vol. 1, pp. 171–174, 176–179, 1986.*

* cited by examiner

*Primary Examiner*—Charles Bowers
*Assistant Examiner*—Thanh Nguyen

(57) ABSTRACT

Methods and arrangements that increase the process control during the fabrication of the control gate configuration in a non-volatile memory semiconductor device are provided. The methods and arrangements effectively prevent cracks from developing within a tungsten suicide layer that is part of a control gate structure within a non-volatile memory cell. Cracks within the tungsten silicide layer can affect the performance of the memory cell by increasing the resistance of the control gate configuration. The methods and arrangements prevent cracking of the tungsten silicide layer by minimizing the relative difference between temperatures associated with the deposition of the tungsten suicide layer and deposition of a subsequent overlying cap layer.

9 Claims, 4 Drawing Sheets

METHODS AND ARRANGEMENTS FOR REDUCING STRESS AND PREVENTING CRACKING IN A SILICIDE LAYER

TECHNICAL FIELD

The present invention relates to semiconductor devices and manufacturing processes, and more particularly to methods and arrangements associated with the formation of silicide layers in non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lies.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric layer 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film, of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the features depicted in the memory cells of FIGS. 1a–b, places a burden on the fabrication process to deposit/form the floating, gate 16 and control gate 26 without creating deleterious effects within the memory cell. Of particular concern, caused by the shrinking dimensions, is the need to provide adequate electrical isolation between each of the floating gates 16a–c, and between each of the floating gates 16a–c and control gate 26, while also providing an adequately arranged floating/control gate configuration. For example, one of the problems that has been encountered with reduced-size semiconductor devices is the tendency for deleterious cracks to form due to stress within control gate structures that employ silicide layer 28.

SUMMARY OF THE INVENTION

These needs and others are met by the present invention, which provides methods and arrangements that increase the process control during the fabrication of semiconductor devices, and in particular, during the formation of a silicide layer and cap layer within a control gate configuration in a non-volatile memory semiconductor device.

In accordance with one aspect of the present invention, it has been found that in certain semiconductor arrangements, the topology created by the space between adjacent floating gates cars be so severe in shape (e.g., deep and narrow) that the silicide layer formed on the overlying control gate often contains significant depressions over the space. These significant depressions can lead to cracks in the silicide layer during subsequent thermal processing during the fabrication of the semiconductor device, which tends to stress and/or alter the silicide layer.

In accordance with one aspect of the present invention, the amount of stress in the silicide layer is reduced by altering the process by which the silicide layer is formed and/or the subsequent process by which an overlying cap layer is formed on the silicide layer. For example, instead of a conventional polysilicon cap layer that requires a high deposition temperature of about 680° C., in accord with certain aspects of the present invention an amorphous polysilicon cap layer that only requires a deposition temperature of about 500° C. is employed to reduce the amount of thermally induced stress within the silicide layer.

Thus, in accordance with certain embodiments of the present invention, a method for forming a silicide layer and a cap layer in a semiconductor device is provided. The method includes depositing a silicide layer on a first layer at a first deposition temperature, and depositing a cap layer on the silicide layer at a second deposition temperature, wherein a temperature difference between the first deposition temperature and the second deposition temperature is less than about 250° C. Having a reduced temperature difference, for example, less than about 250° C., has been found to significantly reduce cracking of the silicide layer.

For example, in accordance with certain embodiments of the present invention, the step of depositing the silicide layer includes forming tungsten silicide on the first layer using chemical vapor deposition (CVD) techniques and reacting $SiH_4$ and $WF_6$ at a temperature at between about 350° C. to about 400° C. In accordance with still other embodiments of the present invention, the step of depositing the silicide layer includes forming tungsten silicide on the first layer using chemical vapor deposition (CVD) techniques and reacting $SiH_2Cl_2$ and $WF_6$ at a temperature of about 580° C. In accordance with certain embodiments of the present invention, the step of depositing a cap layer includes forming polysilicon, such as, for example, amorphous polysilicon, on the silicide layer using either low temperature oxide (LTO) techniques or plasma enhanced chemical vapor deposition (PECVD) techniques, such tat the second deposition temperature is less than about 500° C.

The above stated needs are also met by a method for forming a silicide layer and a cap layer in a semiconductor device, in accordance with certain embodiments of the present invention. The method includes depositing a silicide layer on a first layer, and then depositing a cap layer of amorphous polysilicon on the silicide layer. Since the amorphous silicon in the cap layer can be deposited at a deposition temperature that is relatively close to the deposition temperature of the silicide layer, the silicide layer is less likely to crack due to stress.

In accordance with still further embodiments of the present invention, a semiconductor device is provided. The semiconductor device includes a first polysilicon layer, a silicide layer on the polysilicon layer, and an amorphous polysilicon layer on the silicide layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
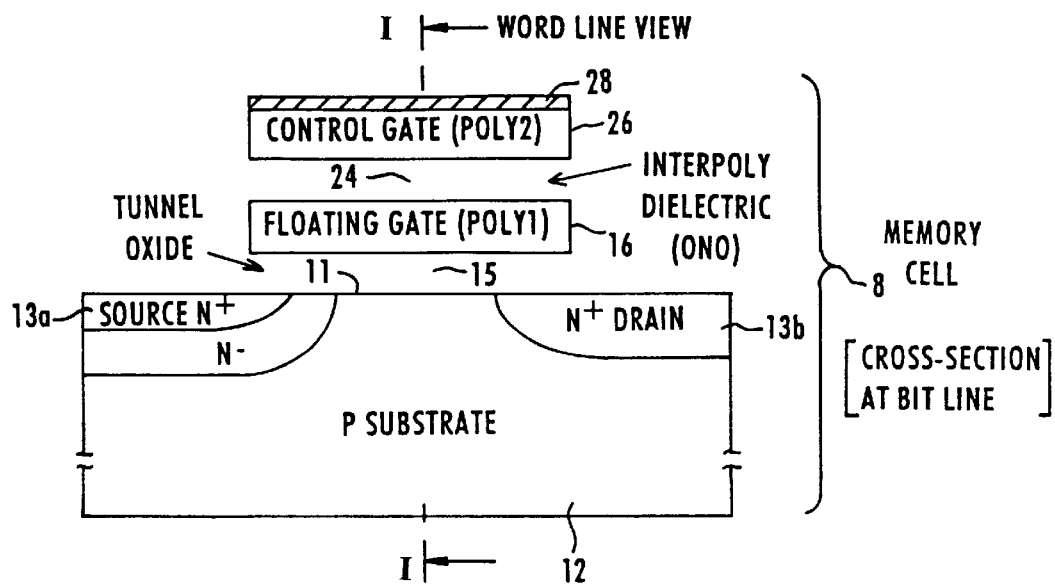
FIG. 1a depicts a cross-sectional view of a portion of a typical prior art semiconductor device having at least one memory cell, as viewed at the bit-line.
Figure 1B:
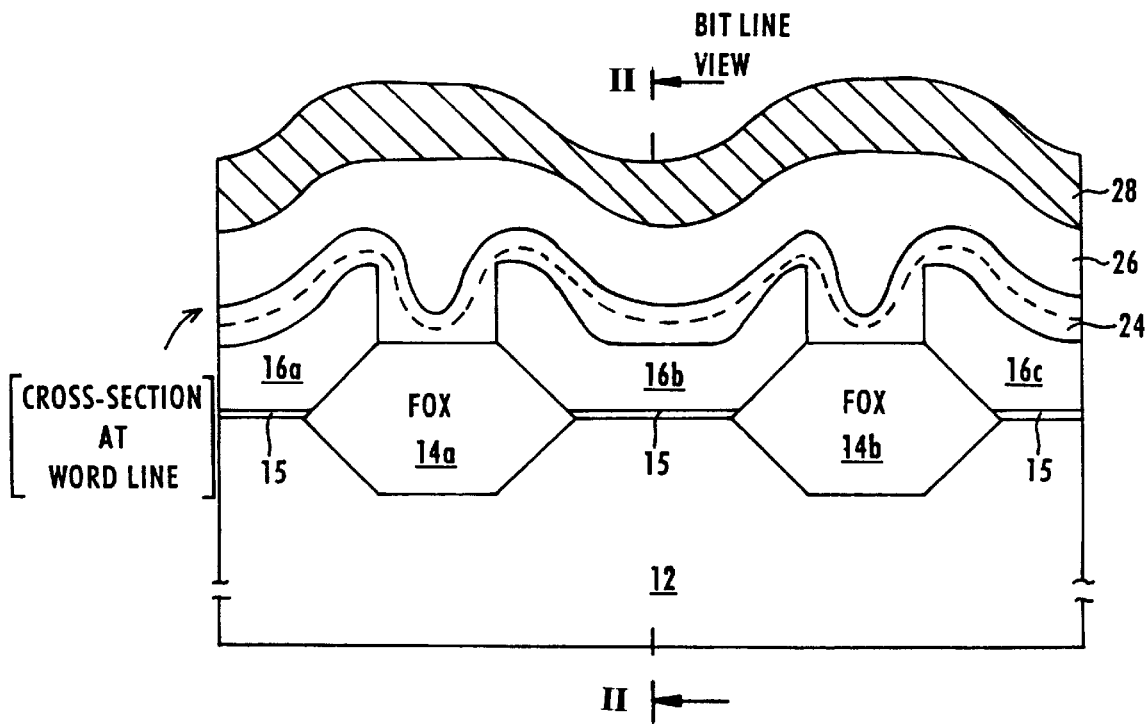
FIG. 1b depicts a cross-sectional view of a portion of a typical prior art semiconductor device, as in FIG. 1, having at least one memory cell, as viewed at the word-line.
Figure 2A:
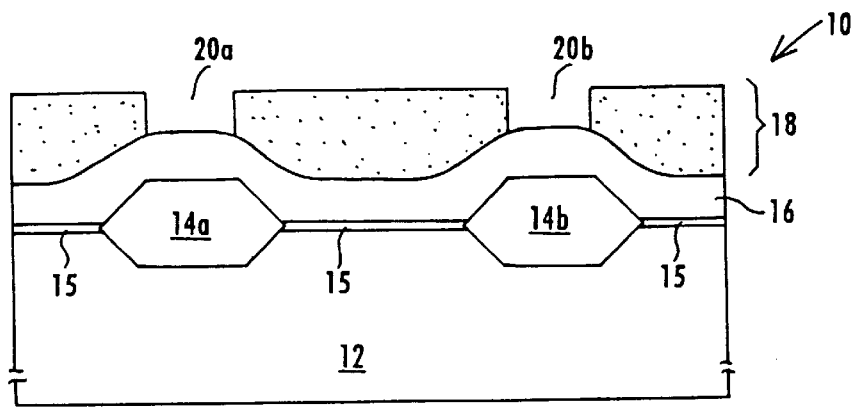
FIG. 2a depicts a cross-sectional view of a portion of a conventional semiconductor device during the formation of a plurality of floating gates.

FIG. 2a depicts a portion 10 of a semiconductor device as viewed from a cross-sectional perspective through the word line (similar to FIG. 1b). Portion 10, in FIG. 2a, depicts the formation of floating gates 16a–c from at least one layer of polysilicon 16. As shown, polysilicon layer 16 is conformal and covers exposed portions of tunnel oxide 15 and field oxides 14a–b. Polysilicon layer 16 is deposited, for example, using conventional deposition techniques, such as, chemical vapor deposition (CVD) or plasma enhanced CVD (PECVD) techniques. To pattern polysilicon layer 16 into floating gates 16a–16c (see FIG. 2b) a mask 18 is typically formed and patterned on polysilicon layer 16. Mask 18, which is typically a lithographic mask, includes openings 20a–20b that selectively expose portions of the underlying polysilicon layer 16. The formation of floating gates 16a–16c includes anisotropic etching, such as certain reactive ion etching (RIE) or plasma etching processes that remove the exposed portions of polysilicon layer 16 through openings 20a–b, and stop on field oxides 14a–b.

Figure 2B:
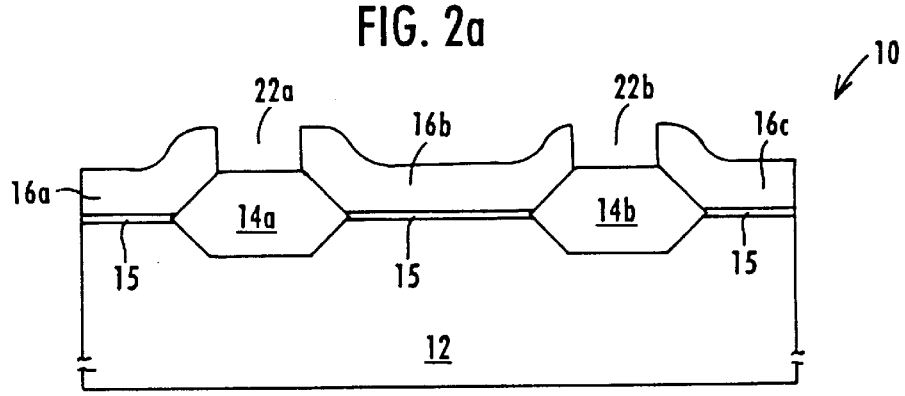
FIG. 2b depicts the portion of FIG. 2a following a selective etching process, which forms a plurality of floating gates.

In FIG. 2b, portion 10 has been etched and mask 18 has been stripped away, for example, using conventional stripping techniques, to form floating gates 16a–c. The etching process creates spaces 22a and 22b. Spaces 22a–22b tend to be relatively narrow in width and bordered by significant steps up to the floating gates 16a–c, as applicable. For example, in sub-micron flash memories, spaces 22a and 22b can be between about 1000 and about 4000 Angstroms wide. Floating gates 16a–c are typically about 900 to 1,100 Angstroms thick. Consequently, the critical dimension of spaces 22a–b represents a significantly severe topology over which the subsequent layers (e.g., interpoly dielectric layer 24, control gate 26 and suicide layer 28) are formed.

Figure 2C:
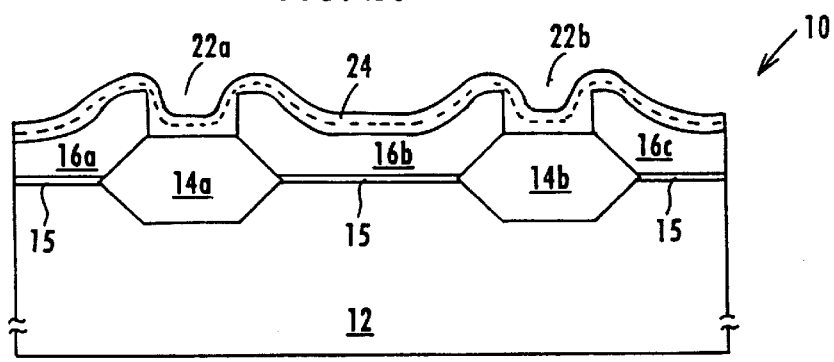
FIG. 2c depicts the portion of FIG. 2b following formation an interpoly dielectric layer over the floating gates.

FIG. 2c depicts portion 10 of FIG. 2b following conformal deposition of interpoly dielectric layer 24 over floating gates 16a–c and field oxides 14a–b within spaces 22a and 22b, respectively. In certain preferred embodiments of the present invention, interpoly dielectric layer 24 is an ONO layer. An ONO layer is formed, for example, by a three stage deposition process in which a first film of silicon dioxide (e.g., about 50 Angstroms thick) is deposited or grown on floating gates 16a–c, followed by deposition of a film of silicon nitride (e.g., about 80 Angstroms thick), and then deposition of a second film of silicon dioxide (e.g., about 40 Angstroms thick). The ONO layer provides a thin, highly insulative dielectric layer that separates the floating gate 16 from the control gate 26, as depicted in FIG. 2d.

Figure 2D:
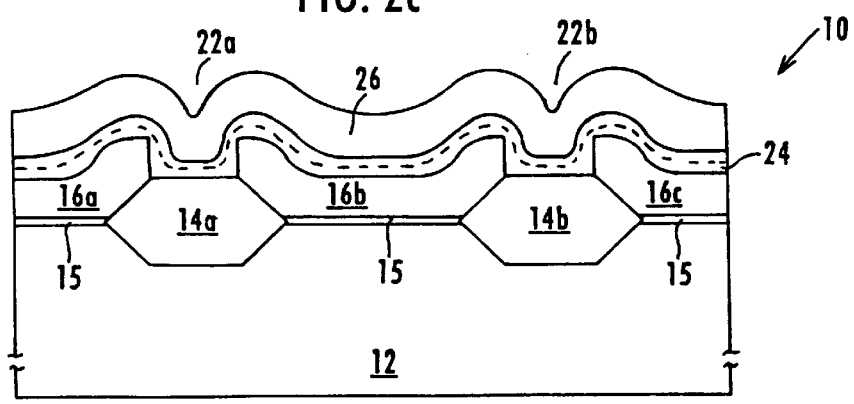
FIG. 2d depicts the portion of FIG. 2c following formation of a control gate polysilicon layer on the interpoly dielectric layer.
Figure 2E:
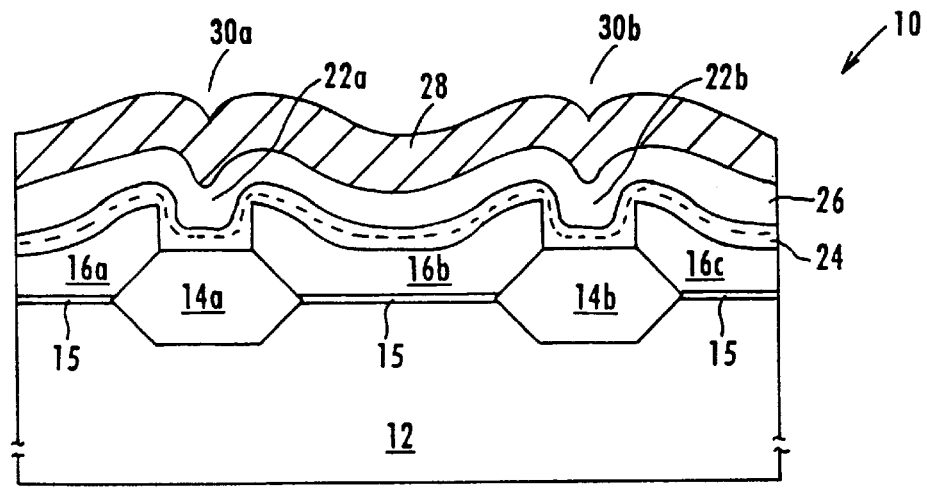
FIG. 2e depicts the portion of FIG. 2d following formation of a conventional silicide layer on the control gate polysilicon layer.

In FIG. 2d, the portion 10 of FIG. 2c has been further processed to include a conformal polysilicon layer that is patterned to form the control gate 26. Polysilicon layer (e.g., 26) is typically deposited to a thickness of about 1,200 Angstroms using conventional deposition techniques, such as, CVD and PECVD techniques. A silicide layer 28, for example tungsten silicide (e.g., $WSi_2$), is then formed on top of the polysilicon layer 26, as depicted in FIG. 2e. Although not visible from the word line cross-sectional perspective of FIG. 2d, the polysilicon layer 26 is then selectively patterned using conventional polysilicon etching processes to form control gate 26.

Silicide layer 28 increases the conductivity of the control gate 26 and is designed to carry a significant portion of the programming current during the programming of the memory cells. Silicide layer 28 is typically between about 1100 to about 1700 Angstroms thick, and more preferably between about 1200 to 1500 Angstroms thick.

As shown in FIG. 2e, the step coverage of silicide layer 28 above spaces 22a–b often results in the formation of depressions 30a–b, respectively. Depressions 30a–b tend to form as the thickness of the conformal silicide material increases and eventually fills in the region over spaces 22a–b.

Figure 2F:
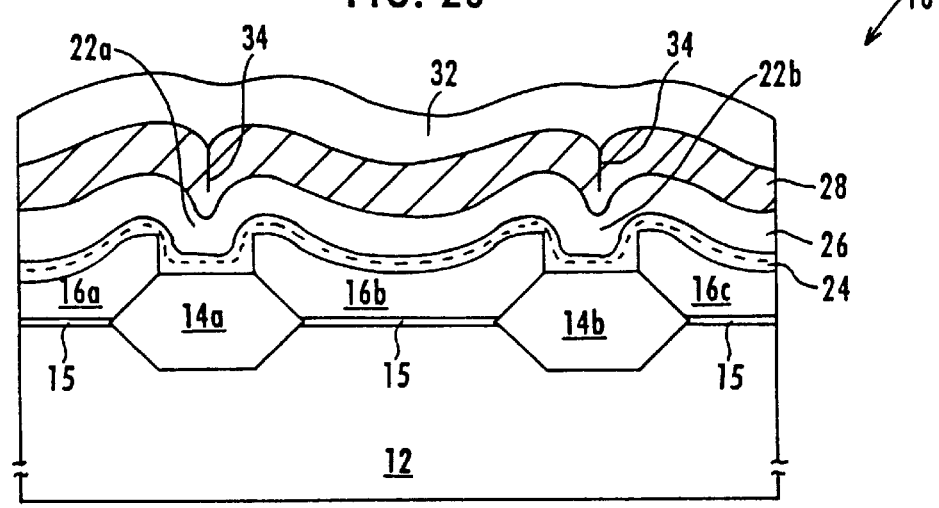
FIG. 2f depicts the portion of FIG. 2e following formation of a conventional cap layer on the silicide layer and the formation of cracks in the underlying silicide layer due, at least in part to the thermal processing associated with the formation of the cap layer.

Next, as depicted in FIG. 2f, a cap layer 32 is formed on silicide layer 28. Cap layer 32, which typically includes polysilicon, is configured to reduce the stress within silicide layer 28. If there is too much stress within silicide layer 28 then silicide layer 28 tends to lift off of the underlying control gate 26, thereby damaging the semiconductor device. It is believed that cap layer 32 reduces the stress within silicide layer 28 by allowing silicide layer 28 to absorb polysilicon from cap layer 12. Thus, silicide layer 28 absorbs polysilicon from both the underlying control gate 26 and the overlying cap layer 32. This "sandwich" configuration tends to reduce the stress within silicide layer 28 by essentially balancing the amount of polysilicon that is eventually absorbed in the upper and lower regions of silicide layer 28.

It has been found, however, that the depressions 30a–b in silicide layer 28 can develop into separations or cracks, such as cracks 34 in FIG. 2f, during the formation of cap layer 32. The deposition of a conventional cap layer 32 typically includes raising the temperature of portion 10. It has been found that a sufficient increase in the temperature of portion 10 can lead to an increase in the granularity of the amorphous tungsten silicide within silicide layer 28, thereby reducing the grain boundaries and the overall volume of silicide layer 28. The reduced volume can cause cracks 34 to develop within silicide layer 28.

By way of example, the temperature associated with a typical tungsten silicide deposition process is between about 350° C. to about 400° C., while the temperature associated with a typical polysilicon cap layer deposition process is between about 680° C. to about 750° C. Thus, there is a relative difference in deposition temperatures of between about 250° C. to about 400° C. This difference tends to increase cracking within silicide layer 28.

Cracks 34 can extend partially through silicide layer 28, or in some cases can extend all the way through silicide layer 28 to control gate 26. In either case, cracks 34 increase the resistance in the control gate 26 and degrade the performance of the flash memory and/or damage the semiconductor device. By way of example, in certain situations the cracking of silicide layer 28 has caused then resistance of a word line to increase by 100 times.

It has been found that the cracking of silicide layer 28 is more prominent when the width of spaces 22a–b between the floating gates 16a–c are each less than approximately 4000 Angstroms. In certain preferred embodiments of the present invention, spaces 22a–b are each approximately 2600 Angstroms wide, and the thickness of each of the floating gates 16a–c is approximately 900 to 1,100 Angstroms. The resulting topology has been found to cause a significant amount of cracking of silicide layer 28 during the formation of cap layer 32 and in some cases during subsequent thermal processing such as thermal anneal processing.

In accordance with certain embodiments of the present invention, the cracking of silicide layer 28 is substantially reduced, if not entirely eliminated, by modifying one or more of the deposition processes associated with the formation of silicide layer 28 and/or cap layer 32. In particular, it was found that the formation of cracks 34 can be significantly reduced, and substantially avoided, by increasing the deposition temperature of silicide layer 28 and/or reducing the deposition temperature of cap layer 32. Consequently, when the relative difference in temperatures between the two deposition processes is reduced, the amount, of cracking in silicide layer 28 is significantly reduced.

Figure 3A:
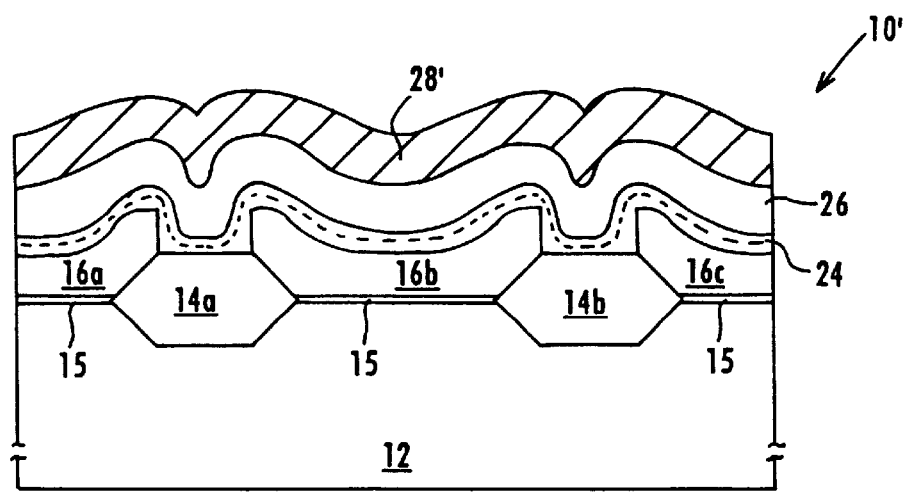
FIG. 3a depicts the portion of FIG. 2d following formation of a silicide layer on the control gate polysilicon layer, in accordance with certain embodiments of the present invention.

With this in mind, FIG. 3a depicts a portion 10' following the formation of a silicide layer 28' (e.g., $WSi_x$) on control gate 26, in accordance with certain embodiments of the present invention. In accord with a first exemplary embodiment, silicide layer 28' is a silane based tungsten silicide that is formed in a conventional thermal CVD tool at a temperature of between about 350° C. to about 400° C., using $SiH_4$ and $WF_6$. This type of "low temperature" silicide deposition process typically results in an amorphous layer of tungsten silicide, such as in portion 10 of FIG. 2e.

In accord with a second exemplary embodiment, silicide layer 28' is a dichlorosilane (DCS) based tungsten silicide that is formed in a conventional thermal CVD tool at a temperature of at least about 580° C., using $SiH_2Cl_2$ and $WF_6$. This type of "high temperature" silicide deposition process typically results in a more granular (e.g., polycrystalline) layer of tungsten silicide.

Figure 3B:
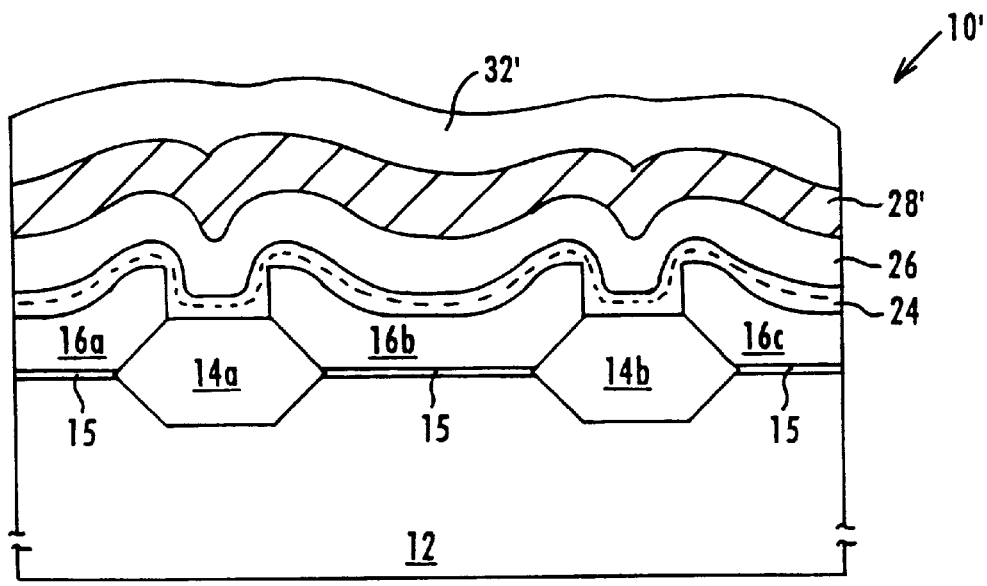
FIG. 3b depicts the portion of FIG. 3a following formation of a low temperature cap layer on the silicide layer, in accordance with certain embodiments of the present invention.

FIG. 3b depicts portion 10' following the formation of a cap layer 32' on silicide layer 28', in accordance with certain embodiments of the present invention. In accord with a first exemplary embodiment, cap layer 32' is a layer of amorphous polysilicon that is deposited in a conventional low temperature oxide (LTO) furnace at a temperature of between about 450° C. to about 500° C. In accordance with certain embodiments of the present invention, this type of "LTO" amorphous polysilicon deposition process can be employed following most conventional silicide deposition processes, including, for example, the low temperature and high temperature silicide deposition processes described above, to reduce cracking in silicide layer 28'.

In accordance with certain embodiments of the present invention, it is preferred that the "LTO" amorphous polysilicon deposition process be employed in conjunction with a high temperature silicide deposition process, for example, as described above, to minimize the relative difference in temperatures between the two deposition processes and significantly reduce the potential for cracking in silicide layer 28'. By way of example, if the temperature associated with a "high temperature" silicide deposition process is about 580° C. and the temperature associated with the "LTO" amorphous polysilicon deposition process is between about 450° C. to about 500° C., then the relative difference in deposition temperatures is only between about 80° C. to about 130° C.

In accord with a second exemplary embodiment, cap layer 32' is a layer of amorphous polysilicon that is deposited in a conventional plasma enhanced chemical vapor deposition (PECVD) tool at a temperature of about 450° C. This type of "PECVD" polysilicon deposition process can be employed following most conventional silicide deposition processes, including, for example, the low temperature and high temperature silicide deposition processes described above, to reduce cracking in the silicide layer 28'.

In accordance with certain embodiments of the present invention, it is preferred that the "PECVD" amorphous polysilicon deposition process is employed in conjunction with a high temperature silicide deposition process, for example, as described above, to minimize the relative difference in temperatures between the two deposition processes and significantly reduce the potential for cracking in silicide layer 28'. By way of example, if the temperature associated with a "high temperature" silicide deposition process is about 580° C. and the temperature associated with the "PECVD" amorphous polysilicon deposition process is about 450° C., then the relative difference in deposition temperatures is only about 130° C.

Figures 4A, 4B:
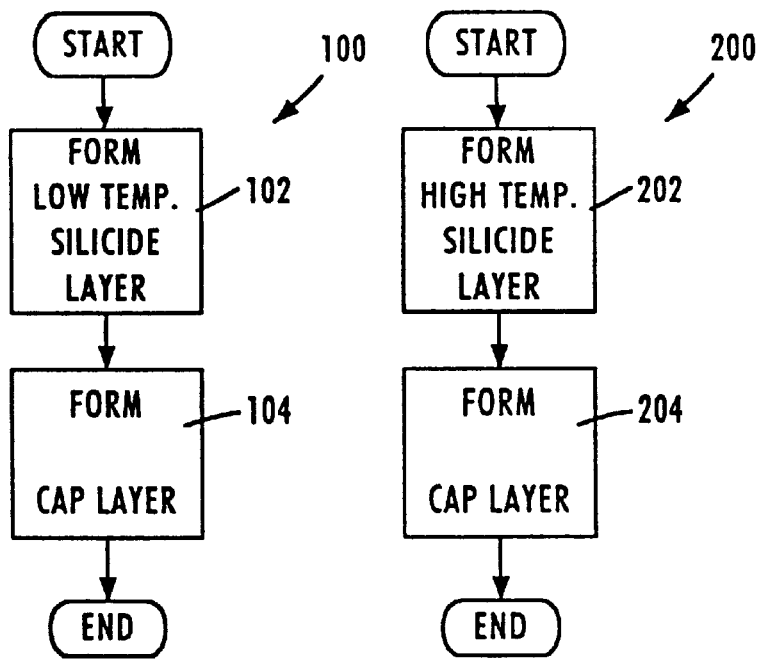
FIG. 4a is a flowchart depicting a first exemplary method for forming a silicide layer and at low temperature cap layer, as depicted in FIG. 3b, in accordance with certain embodiments of the present invention.
FIG. 4b is a flowchart depicting a second exemplary method for forming a silicide layer and a low temperature cap layer, as depicted in FIG. 3b, in accordance with still other embodiments of the present invention.

FIG. 4a depicts a method 100 for reducing cracking in the silicide layer 28', in accordance with certain embodiments of the present invention. Method 100 includes forming a "low temperature" silicide layer in step 102, using conventional tungsten silicide deposition techniques. In step 104, a "low temperature" cap layer 32' is formed on silicide layer 28'. For example, a "low temperature" cap layer can be either a "LTO" or a "PECVD" cap layer, as described above. Preferably, the relative difference in deposition temperatures associated with steps 102 and 104 is less than about 250° C.

FIG. 4b depicts a method 200 for reducing cracking in silicide layer 28', in accordance with still other embodiments of the present invention. Method 200 includes forming a "high temperature" silicide layer in step 102, using conventional tungsten silicide deposition techniques. In step 104, a "low temperature" cap layer 32' is formed on the silicide layer 28'. For example, a "low temperature" cap layer can be either a "LTO" or a "PECVD" cap layer, as described above. Preferably, the relative difference in deposition temperatures associated with steps 102 and 104 is less than about 250° C.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for forming a silicide layer and a cap layer in a semiconductor device, the method comprising:

forming a polysilicon floating gate on an underlying layer;

depositing an interpoly dielectric layer over the floating gate;

forming a polysilicon control gate over the interpoly dielectric layer;

depositing a silicide layer on the polysilicon control gate at a first deposition temperature;

depositing a cap layer on the silicide layer at a second deposition temperature, wherein a temperature difference between the first deposition temperature and the second deposition temperature is less than about 250° C., thereby significantly reducing cracking in the silicide layer, wherein the step of depositing the cap layer includes forming polysilicon on the silicide layer, and wherein the step of forming polysilicon includes forming amorphous polysilicon using low temperature oxide (LTO) techniques wherein the second deposition temperature is less than about 500° C.

2. The method as recited in claim 1, wherein the step of depositing the silicide layer includes forming tungsten silicide on the first layer.

3. The method as recited in claim 2, wherein the step of forming tungsten silicide further includes using chemical vapor deposition (CVD) techniques and reacting $SiH_4$ and $WF_6$.

4. The method as recited in claim 3, wherein the step of using chemical vapor deposition (CVD) techniques further includes maintaining the first deposition temperature at between about 350° C. to about 400° C.

5. The method as recited in claim 2, wherein the step of forming tungsten silicide further includes using chemical vapor deposition (CVD) techniques and reacting $SiH_2Cl_2$ and $WF_6$.

6. The method as recited in claim 5, wherein the step of using chemical vapor deposition (CVD) techniques further includes maintaining the first deposition temperature at about 580° C.

7. The method as recited in claim 1, wherein the second deposition temperature is about 450° C.

8. The method as recited in claim 7, wherein the second deposition temperature is about 450° C.

9. A method for forming a silicide layer and a cap layer in a semiconductor device, the method comprising:

forming a polysilicon floating gate on an underlying layer;

depositing an interpoly dielectric layer over the floating gate;

forming a polysilicon control gate over the interpoly dielectric layer;

depositing a silicide layer on the polysilicon control gate at a first deposition temperature;

depositing a cap layer on the silicide layer at a second deposition temperature, wherein a temperature difference between the first deposition temperature and the second deposition temperature is less than about 250° C., thereby significantly reducing cracking in the silicide layer, wherein the step of depositing the cap layer includes forming polysilicon on the silicide layer, and wherein the step of forming polysilicon includes forming amorphous polysilicon using plasma enhanced chemical vapor (PECVD) techniques wherein the second deposition temperature is less than about 500° C.

* * * * *